US008003300B2

(12) United States Patent
Jain et al.

(10) Patent No.: US 8,003,300 B2
(45) Date of Patent: Aug. 23, 2011

(54) METHODS FOR FABRICATING COMPLEX MICRO AND NANOSCALE STRUCTURES AND ELECTRONIC DEVICES AND COMPONENTS MADE BY THE SAME

(75) Inventors: Kanti Jain, Urbana, IL (US); Uttam Reddy, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 843 days.

(21) Appl. No.: 11/734,600

(22) Filed: Apr. 12, 2007

(65) Prior Publication Data

US 2008/0251877 A1 Oct. 16, 2008

(51) Int. Cl.
*G03F 7/22* (2006.01)
(52) U.S. Cl. ........ 430/311; 430/315; 430/313; 430/394; 250/492.22
(58) Field of Classification Search .................. None
See application file for complete search history.

(56) References Cited

U.S. PATENT DOCUMENTS

| | | | |
|---|---|---|---|
| 4,334,349 A | 6/1982 | Aoyama et al. |
| 4,414,059 A | 11/1983 | Blum et al. |
| 4,700,462 A | 10/1987 | Beaubien et al. |
| 4,780,177 A | 10/1988 | Wojnarowski et al. |
| 4,842,677 A | 6/1989 | Wojnarowski et al. |
| 4,865,873 A | 9/1989 | Cole et al. |
| 4,877,644 A | 10/1989 | Wu et al. |
| 4,959,326 A | 9/1990 | Roman et al. |
| 5,053,348 A | 10/1991 | Mishra et al. |
| 5,155,053 A | 10/1992 | Atkinson |
| 5,232,549 A | 8/1993 | Cathey et al. |
| 5,285,236 A | 2/1994 | Jain |
| 5,514,618 A | 5/1996 | Hunter, Jr. et al. |
| 5,679,472 A | 10/1997 | Wu et al. |
| 5,702,565 A | 12/1997 | Wu et al. |
| 5,908,719 A | 6/1999 | Guckel et al. |
| 5,976,968 A | 11/1999 | Dai |
| 6,140,226 A | 10/2000 | Grill et al. |
| 6,277,318 B1 | 8/2001 | Bower et al. |
| 6,289,751 B1 | 9/2001 | Mathur et al. |
| 6,348,295 B1 | 2/2002 | Griffith et al. |
| 6,355,399 B1 | 3/2002 | Sajan et al. |
| 6,403,456 B1 | 6/2002 | Plat et al. |
| 6,448,176 B1 | 9/2002 | Grill et al. |
| 6,495,448 B1 | 12/2002 | Lee |
| 6,593,687 B1 | 7/2003 | Pei et al. |
| 6,635,404 B1 | 10/2003 | Choi et al. |
| 6,714,810 B2 | 3/2004 | Grzeszczuk et al. |
| 6,717,650 B2 | 4/2004 | Jain |
| 6,962,771 B1 | 11/2005 | Liu et al. |
| 6,988,925 B2 | 1/2006 | Arthur et al. |
| 7,078,351 B2 | 7/2006 | Chiu et al. |
| 7,095,484 B1 | 8/2006 | Fries |
| 7,167,296 B2 | 1/2007 | Meisburger |
| 7,180,575 B2 | 2/2007 | Kasumi et al. |
| 7,196,005 B2 | 3/2007 | Ho |
| 7,264,990 B2 | 9/2007 | Rueckes et al. |
| 2004/0125254 A1 | 7/2004 | Chae et al. |
| 2005/0067286 A1 | 3/2005 | Ahn et al. |
| 2005/0147895 A1 | 7/2005 | Change et al. |
| 2005/0158668 A1 | 7/2005 | Bittner et al. |
| 2005/0185891 A1 | 8/2005 | Kim et al. |
| 2006/0099731 A1 | 5/2006 | Buckley et al. |
| 2006/0188721 A1 | 8/2006 | Irvin et al. |
| 2006/0223245 A9 | 10/2006 | Pellens et al. |
| 2006/0256307 A1 | 11/2006 | Fries |
| 2006/0289976 A1 | 12/2006 | Min |
| 2007/0003878 A1 | 1/2007 | Paxton et al. |
| 2008/0176398 A1 | 7/2008 | Jain et al. |
| 2009/0023098 A1 | 1/2009 | Jain et al. |
| 2009/0239042 A1 | 9/2009 | Jain et al. |

FOREIGN PATENT DOCUMENTS

| | | |
|---|---|---|
| TW | 0488028 B | 5/2002 |
| WO | WO 2005/086982 | 9/2005 |
| WO | WO 2009/005863 | 1/2009 |

OTHER PUBLICATIONS

Chae et al. (2007) "Pattern of Indium Tin Oxide Projection Photoblation and Lift-Off Process for Fabrication of Flat Panel Displays," *Appl. Phys. Lett.* 90:261102.
Chae et al. (Jan. 29, 2008) "Excimer Laser Projection Photoblation and Lift-Off Process for Patterning of Indium-Tin-Oxide for Cost Effective Fabrication of Flat-Panel Displays," *Proc. SPIE* 6911:69110P.
Chen et al. (Nov. 1999) "Electron Beam Lithography Process for T- and Γ-Shaped Gate Fabrication Using Chemically Amplified DUV Resists and PMMA," *J. Vac. Sci. Technol. B.* 17(6):2507-2511.
Chen et al. (2002) "Thin Film Patterning by Laser Lift-Off," *Jpn. J. Appl. Phys.* 41:3099-3100.
Choi et al. (2001) "Electrophoresis Deposition of Carbon Nanotubes for Triode-Type Field Emission Display," *Appl. Phys. Lett.* 78(11):1547-1549.

(Continued)

*Primary Examiner* — Daborah Chacko Davis
(74) *Attorney, Agent, or Firm* — Greenlee Sullivan P.C.

(57) ABSTRACT

This invention provides processing steps, methods and materials strategies for making patterns of structures for electronic, optical and optoelectronic devices. Processing methods of the present invention are capable of making micro- and nano-scale electronic structures, such as T-gates, gamma gates, and shifted T-gates, having a selected non-uniform cross-sectional geometry. The present invention provides lithographic processing strategies for sub-pixel patterning in a single layer of photoresist useful for making and integrating device components comprising dielectric, conducting, metal or semiconductor structures having non-uniform cross-sectional geometries. Processing methods of the present invention are complementary to conventional microfabrication and nanofabrication platforms, and can be effectively integrated into existing photolithographic, etching and thin film deposition patterning strategies, systems and infrastructure.

28 Claims, 12 Drawing Sheets

OTHER PUBLICATIONS

Choi et al. (1999) "Fully Sealed, High-Brightness Carbon-Nanotube Field-Emission Display," *Appl. Phys. Lett.* 75(20):3129-3131.

Dharap et al. (2004) "Nanotube Film Based on Single0Wall Carbon Nanotubes for Strain Sensing," *Nanotech.* 15:379-382.

Duley et al. (1996) "Interactions and Effects in Semiconductors," In; *UV Lasers: Effects and Applications in Materials Science*, Cambridge University Press, Cambridge, UK pp. 308-356.

Fennimore et al. (Jul. 24, 2003) "Rotational Actuators Based on Carbon Nanotubes," *Nature* 424:408-410.

Grunbacher et al. (Jan. 1997) "Single Step Lithography for Double Recessed Gate Pseudomorphic High Electron Mobility Transistors," *J. Vac. Sci. Technol. B* 15(1):49-52.

Hayes et al. (2001) "A Laser-Ablation and Lift-Off Technique for Fabricating Simple Microfluidic Devices," *Proc. SPIE* 4236:115-125.

Huemoeller et al. (Jun. 2007) "Unveiling the Next Generation in IC Substrate Circuit Formation," *CircuiTree* 20(6):12-18.

Hwu et al. (2003) "A Novel Double-Recessed 0.2-μm T-Gate Process for Heterostructure InGap-InGaAs Doped0CHannle FET Fabrication," *IEEE Electron. Dev. Lett.* 24(6):381-383.

Jain, K. (1990)"Excimer Laser Etching and Deposition," In; *Excimer Laser Lithography*, SPIE Press, Bellingham, WA, pp. 176-189.

Jain et al. (Aug. 2005) "Flexible Electronics and Displays: High-Resolution, Roll-to-Roll, Projection Lithography and Photoablation Processing Technologies for High-Throughput Production," *Proc. IEEE* 93(8):1500-1510.

Jain et al. (Oct. 2002) "Large-Area, High-Resolution Lithography and Photoablation Systems for Microelectronics and Optoelectronics Fabrication," *Proc. IEEE* 90(10):1681-1688.

Jain et al. (Aug. 2002) "Large-Area Excimer Laser Lithography and Photoablation Systems," *Microlithography World* 11(3):8-10.

Klosner et al. (Jul. 2002) "High Resolution, Large Area Projection Lithography Offers a New Alternative for Wafer-Level Packaging," *Chip Scale Review* 6(4):75-80.

Kocabas et al. (2007) "Experimental and Theoretical Studies of Transport Through Large Scale, Partially Aligned Arrays of Single-Walled Carbon Nanotubes in Thin Film Type Transistors," *Nano Lett.* 7(5):1195-1202.

Lee et al. (Jul. 2006) "Process for 20nm T Gate on $Al_{0.25}Ga_{0.75}As/In_{0.2}Ga_{0.8}As/GaAs$ Epilayer Using Two-Step Lithography and Zig-zag Foot," *J. Vac. Sci. Technol. B* 24(4):1869-1872.

Lee et al. (Jul. 2005) "Sub-50 nm T-Gate Pseudomorphic HEMTs Using Low Temperature Development Method," *Proceedings of the 2005 5th Conference on Nanotechnology*, Nagoya, Japan.

Lin et al. (Jul. 2004) "Single Step Electron-Beam Lithography for Asymmetric Recess and Gamma Gate High Electron Mobility Transistor Fabrication," *J. Vac. Sci. Technol. B* 22(4):1723-1726.

Liu et al. (Nov. 12, 2001) "Carbon Nanotube Field-Effect Inverters," *Appl. Phys. Lett.* 79:3329-3331.

Lu et al. (Jun. 21, 2006) "Nanotube Micro-Optomechanical Actuators," *Appl. Phys. Lett.* 88:253107.

Lu et al. (1995) "Laser-Induced Dry Lift-Off Process," *Jpn. J. Appl. Phys.* 34:L1669-L1670.

Mancini et al. (Aug. 2002) "T-Gate Fabrication for GaAs Processing," *Microthithography World*.

Martel, R. (2002) "Nanotube Electronics: High-Performance Transistors," *Nature. Mat.* 1:203-204.

Meitl et al. (2004) "Solution Casting and Transfer Printing Single-Walled Carbon Nanotube Films," *Nano Lett.* 4(9):1643-1647.

Molpeceres et al. (2005) "Microprossessing of ITO and a-Si Thin Films Using ns Laser Sources," *J. Micromech. Microeng.* 15:1271-1278.

Oh et al. (2003) "Room Temperature Fabrication of High Resolution Carbon Nanotube Field Emission Cathodes by Self-Assembly," *Appl. Phys. Lett.* 82(15):2521-2523.

Pasquier et al. (Nov. 10, 2005) "Conducting and Transparent Single-Wall Carbon Nanotube Electrodes for Polymer-Fullerene Solar Cells," *Appl. Phys. Lett.* 87:203511.

Robin et al. (Nov. 2000) "Evolutionary Optimization of the Electron-Beam Lithography Process for Gate Fabrication of High Electron Mobility Transistors," *J. Vac. Sci. Technol. B* 18(6):3445-3449.

Srinivasan et al. (Sep. 15, 1982) "Self-Developing Photoetching of Poly(ethylene Terephthalate) Films by Far-Ultraviolet Excimer Laser Radiation," *Appl. Phys. Lett.* 41:576-578.

Tabatabaie-Alavi et al. (Aug. 2003) "Evolution of T-Shaped Gate Lithography for Compound Semiconductors Field-Effect Transistors," *IEEE Trans. Semicon. Manufac.* 16(3):365-369.

Thompson et al. (Nov. 1990) "High Aspect Ratio Asymmetric Gate Structures Employed in Novel Self-Aligned Electron Mobility Transistor Technology," *J. Vac. Sci. Technol. B* 8(6):1339-1342.

Yavas et al. (1999) "High-Speed Maskless Laser Patterning of Thin Films for Giant Microelectronics," *J. Appl. Physi.* 38:7131-7134.

Yavas et al. (1999) "Effect of Substrate Absorption on the Efficiency of Laser Patterning of Indium Tin Oxide Thin Films," *J. Appl. Physi.* 85(8):4207-4212.

International Search Report, corresponding to International Application No. PCT/US08/59173, issued Dec. 9, 2008.

Written Opinion of the International Searching Authority, corresponding to International Application No. PCT/US08/59173, mailed Dec. 9, 2008.

Klosner et al. (2004) "Massively Parallel, Large—Area Maskless Lithography," *Appl. Phys. Lett.* 84(15)2880-2882.

METHODS FOR FABRICATING COMPLEX MICRO AND NANOSCALE STRUCTURES AND ELECTRONIC DEVICES AND COMPONENTS MADE BY THE SAME

CROSS-REFERENCE TO RELATED APPLICATIONS

Not applicable

STATEMENT REGARDING FEDERALLY SPONSORED RESEARCH OR DEVELOPMENT

Not Applicable

BACKGROUND OF INVENTION

Advanced microfabrication and nanofabrication patterning techniques enable the fabrication and assembly of structures on substrate surfaces. The spectrum of available patterning techniques includes photolithography, soft lithography (e.g., contact printing), electron beam direct writing, and photoablation patterning methods. This suite of available patterning techniques is compatible with a wide range of substrates and deposition materials, including high quality semiconductors, dielectrics and conducting materials, and is compatible with processing a useful range of substrate materials, morphologies, and sizes. In combination with state of the art resist processing and materials deposition techniques, advanced patterning techniques provide a high degree of deterministic control over the physical dimensions and spatial arrangements of patterned structures having dimensions ranging from a few nanometers to thousands of microns.

Given the precision and versatility provided by these methods, advanced substrate patterning techniques provide a commercially viable fabrication platform for accessing a range of useful functional structures and devices. Microfabrication and nanofabrication patterning techniques have been developed that are capable of accessing complex device and device array geometries, including three-dimensional multilayer thin film structures and devices. These techniques currently play a central role in most semiconductor-based technologies including, but not limited to, the manufacture of integrated electronic circuits, memory devices, sensing systems, photovoltaic systems and other microelectronic devices. Furthermore, advanced substrate patterning techniques also provide an effective fabrication pathway for making and integrating nanometer and/or micron scale structures for active and passive elements in micro- and nano-electromechanical systems (MEMS & NEMS) and micro- and nano-fluidic systems.

Motivation for the continued improvement of microfabrication and nanofabrication patterning technology originates, at least in part, from demand for a new class of very high performance densely integrated electronic systems. Developments in advanced patterning techniques, such as deep ultraviolet photolithography, electron beam writing and X-ray lithography methods, have extended the applicability of these techniques for generating patterns of structures and features with dimensions as small as tens of nanometers. These advances continue to enhance device component densities accessible by these techniques. Critical to the continued development and commercialization of this field, however, is the development of low cost microfabrication and nanofabrication processing strategies for making and integrating nanosized and microsized structures having complex three dimensional shapes necessary for device components in high speed integrated electronic systems, such as RF, wireless and high power devices.

Field effect transistors (FETs) are an example of a class of electronic device for which advances in microfabrication techniques continue to play a significant role in accessing important performance benefits. These devices include traditional silicon based FETs and FETs employing III-V compound semiconductors as active materials commonly called high electron mobility transistors (HEMTs). FETs comprise a semiconductor element and three primary electrodes: source, drain and gate electrodes. An electric field established by application of a voltage to the gate electrode is used in these devices to control the shape, and hence conductivity, of a channel in the semiconductor element. Specifically, the voltage applied between gate and source terminals modulates the current passing through the semiconductor provided between sources and drain electrodes. A number of useful FET designs have been developed over the years, including Metal-oxide-Semiconductor Field-Effect Transistors (MOSFET), Metal-Semiconductor-Field-Effect Transistors (MESFET), and Junction Field-Effect Transistor (JFET). FETs are used in a wide range of integrated electronic devices for two primary device functionalities; namely, for switching and for amplifying of current signals. FET devices are also commonly used as voltage-controlled resistors.

A design strategy that has been demonstrated particularly attractive for accessing FETs capable of high switching speeds has been the development of gate electrodes having non-uniform cross-sectional geometries. T-gate electrodes, for example, have been developed having a T-shaped cross-sectional profile including a narrow stem portion and a wider top portion. The narrow stem portion establishes electrical contact with the FET semiconductor channel, thereby defining a small gate length for accessing useful device capacitance and instrinsic transconductance. This geometry allows for submicron gate lengths, which provide reduced gate capacitance and electron transit times. The wider top portion, on the other hand, provides a low resistance path to the stem, thereby minimizing net gate resistance. Accordingly, the T-shape geometry of T-gate electrodes provides a combination of electronic properties useful for enhancing device performance, such as switching speed. A variation of the T-gate electrode has also been developed wherein the wider top portion is offset toward the drain electrode. This electrode configuration, commonly referred to as a gamma-gate (or G-gate), further reduces the net gate to source capacitance and resistance, thereby enhancing device performance.

T-gate and G-gate electrode geometries are particularly attractive for a number of applications. First, T-gate and G-gate electrodes are commonly used in high performance HEMT device structures for important RF (Radio Frequency), High Power and Wireless Applications. Second, T-gate and G-gate electrodes are commonly incorporated into high power devices and multi-finger devices on gallium nitride substrates in the power electronics industry. Third, high frequency circuits using T-gates and G-gates are extremely popular with the telecommunications industry. For example, gallium arsenide based circuits now have more than 80% of the market share when it comes to chips used in cell phones.

There are several methods currently used for fabricating T-gate and G-gate structures for FETs and HEMTs. If the T-gates are manufactured for low volume production, for example, the two most popular methods are: (i) a Bi-Layer resist process, and (ii) a Tri-Layer resist process. U.S. Pat. Nos. 4,959,326, 5,155,053 and 5,053,348 provide examples of conventional methods for making T-gate electrodes using multilayer resist processing protocols. For large scale manufacture processing, T-gates are typically fabricated using two entirely independent lithographic steps. In these methods, the first lithographic step defines and patterns the stem, and the second lithographic step defines and patterns the tee-top of the T-gate structure.

The Bi-Layer resist process uses two photoresist materials: a first of low molecular weight resist and a second of high molecular weight resist. A first resist layer of high molecular weight is applied on the substrate undergoing processing, and a second resist layer of low molecular weight is subsequently applied on top of the first resist layer of high molecular weight. The resist stack of first and second layers is exposed to an electron beam in the case of electron beam lithography (EBL), or to deep ultraviolet electromagnetic radiation (DUV) in the case of DUV Lithography. After this exposure step the substrate is developed. The developer dissolves the exposed region (e.g., for a positive resist) of the first and second resist layers. In addition, the developer reacts chemically with the unexposed regions on the first and second resist layers, thereby dissolving them but at a much slower rate compared to dissolution of the exposed regions of the resist layers. The developer reacts faster with the resist of lower molecular weight than it reacts with the resist of higher molecular weight, thereby generating a recessed feature having a non-uniform cross section (e.g., narrower cross section in high molecular weight resist layer and wider cross section in the lower molecular weight resist layer). Upon deposition of an appropriate gate material(s), the narrow stem portion of the T-gate is formed in the lower, high molecular weight resist layer and the wider top portion is formed in the upper, low molecular weight resist layer because it has developed more than the lower layer high molecular weight resist layer.

In the case of a Tri-Layer process, the process is similar to that described above with the exception that a stack of three resists is used. All three layers can have different rates of chemical reaction with the developer thereby providing additional control on the cross-sectional geometry of the gate electrode. This process is currently used to fabricate complicated T-gate style gates, such as Mushroom Gates, to further lower resistance.

There are currently other more complicated processes of making T-gates and G-gates where multiple layers of different resist materials are used, different developers are used during processing and, optionally, the E-beam (or UV electromagnetic radiation) intensity is selectively varied for each resist layer depending on its molecular weight and chemical composition. In some processing methods, the E-beam (or UV electromagnetic radiation) intensity is also controlled as a function of distance as the beam scans.

The processing steps for gamma gates are similar to that of T-gates. Gamma Gates can be fabricated by making a judicious choice of resists and developers used and also by changing the E-Beam intensity as a function of distance in the direction of the beam scan.

Processing methods for making T-gates and G-gates using multiple resist stacks have several important disadvantages that impede full integration of this technology. First, use of multiple resists and multiple developers is very costly and labor intensive. This is largely because several separate resist deposition and development processing steps are involved, which increase net processing costs at an exponential rate. Second, use of multiple resist layers during processing inevitably results in intermixing of the applied resist layers, which can result in significant deviations in the cross-sectional geometry of the gate structure achieved. Third, the baking temperature required for a second resist layer might not be suitable for the layers of resist (e.g., first resist layer) already applied, which can severely affect the gate cross-sectional profile. Fourth, a developer intended for one resist layer can attack other resist layers, thereby degrading the profile of the structure. Fifth, the resist of highest molecular weight may not receive the desired radiant dose during exposure because of its position at the bottom of the resist stack. This can lead to problems in achieving a desired cross-sectional geometry upon development. In addition, a significant problem arises with the alignment of the stem with the tee-top when T-gates intended for large scale are manufactured via a two step lithographic process.

It will be appreciated from the foregoing that that there is currently a need for microfabrication and nanofabrication processing methods capable of making nanosized and microsized structures having selected non-uniform cross-sectional geometries. Processing methods are needed that are capable of generating structures providing T-gate and G-gate electrodes for high performance FETs and HEMTs. It will also be appreciated that a need exists for new methods of making T-gate and G-gate electrodes that are capable of high throughput and low cost production and integration into FET and HEMT systems.

SUMMARY OF THE INVENTION

This invention provides processing steps, methods and materials strategies for making patterns of structures for electronic, optical and optoelectronic devices. Processing methods of the present invention are capable of making micro- and nano-scale electronic structures, such as T-gates, gamma gates, and shifted T-gates, having a selected non-uniform cross-sectional geometry. The present invention provides lithographic processing strategies for sub-pixel patterning in a single layer of photoresist useful for making and integrating device components comprising conducting, metal or semiconductor structures having non-uniform cross-sectional geometries. Processing methods of the present invention are complementary to conventional microfabrication and nanofabrication platforms, and can be effectively integrated into existing photolithographic, etching and thin film deposition patterning strategies, systems and infrastructure.

Methods of the present invention provide versatile fabrication pathways for making useful structures having non-uniform cross-sectional geometries that eliminate the need for complex, costly and time consuming multiple photoresist deposition, patterning and development processing steps. In an embodiment, the invention provides the capability of making complex structures, such as T-gates and G-gates, by a process employing a single layer of resist. The present methods are compatible with a range of patterned materials, including conductors such as metals, dielectric materials, inorganic and organic semiconductors, and optically functional materials, and are capable of making structures having complex cross-sectional geometries with high resolution and precision. In specific embodiments, methods of the present invention enable important processing steps and low cost fabrication strategies for making high performance semiconductor devices, such as FETs and HEMTS.

In an embodiment, the present invention provides a method of making a structure having a selected non-uniform cross-sectional geometry on a substrate using partially overlapping exposures of a layer of photosensitive material to radiation structures. In an embodiment, a method of the present invention comprises the steps of providing a layer of photosensitive material on at least a portion of the substrate and exposing a first area of the layer of photosensitive material to radiation having a first intensity. A second area of the layer of photosensitive material is exposed to radiation having a second intensity, wherein the second area of the layer partially overlaps the first area of the layer. The layer of photosensitive material is developed by removing material from the first and second areas, thereby generating a recessed feature in the layer having a non-uniform depth profile, wherein the recessed feature exposes an exposed region of the substrate. A material is deposited on the layer of photosensitive material having the recessed feature and on the exposed region of the substrate. The layer of photosensitive material is subsequently removed, thereby making the structure on the substrate. In an embodiment of this aspect particularly useful for high-throughput and low cost substrate processing, a single layer of photosensitive material is used during processing in methods of the present invention.

Optionally, methods of this aspect of the present invention may further comprise steps of exposing additional areas of the photosensitive material to radiation prior to development and depositions processing steps. In an embodiment, for example, methods of the present invention further comprise the step of exposing one or more additional areas of the layer of photosensitive material to radiation having a selected intensity; wherein the additional area(s) of the layer partially overlaps the first area of the layer; the second area of the layer or both the first and second areas of the layer of photosensitive material. These embodiments of the present invention are particularly attractive for making structures having complex cross-sectional geometries.

In methods of this aspect of the present invention, accurate control over the cross-sectional profile of the structure generated on the substrate is provided by selection of a number of important process parameters. First, selection of the areas and positions of first and second areas of the photosensitive material exposed to radiation controls, in part, the cross-sectional geometry of structures fabricated by the present methods. In particular, selection of the extent of overlap of first and second areas provides a means of controlling the cross-sectional dimensions (e.g., thickness and thickness profile) of the fabricated structure as a function of position on the substrate, which is useful in some embodiments for defining the physical dimensions (e.g. the length of the stem extending along the semiconductor element of a FET) and position of the narrow stem portion of T-gate or G-gate electrodes fabricated by the present methods. In addition, selection of the absolute areas of first and second areas of the photosensitive material exposed to radiation provides a means of defining the physical dimensions and shape of the wider top portion (e.g., the Tee cap) of T-gate or G-gate electrodes fabricated by the present methods. Second, selection of the net intensities and spatial distribution of intensities of radiation provided to first and second areas of the photosensitive material and the thickness of the layer of photosensitive material provided to the substrate surface also provides a means of controlling the cross-sectional dimensions (e.g., thickness, and thickness profile) of structures fabricated by the present methods. Third, control of the development and deposition processing conditions (e.g., exposure time of photosensitive layer to developer, developer composition, deposition flux, deposition time etc.) also is useful for controlling the cross-sectional dimensions (e.g., thickness, and thickness profile) and shape of structures fabricated by the present methods.

In some methods of this aspect of the present invention, the first area and the second area overlap in an overlapping area, and portions of the first area and second area do not overlap in one or more non-overlapping areas. In some methods of this aspect, between about 10% to about 90% of the first area of the layer of photosensitive material overlaps with the second area of the layer of photosensitive material, and/or between about 10% to about 90% of the second area of the layer of photosensitive material overlaps with the first area of the layer of photosensitive material. In an embodiment, the first and second intensities are large enough such that the overlapping area is exposed to a net intensity of radiation large enough to provide complete removal of photosensitive material in the overlapping area along the entire thickness of the layer of photosensitive material upon the developing step. In an embodiment, the first and second intensities of radiation are each low enough such that the non-overlapping area is exposed to intensities of radiation that provide partial, but not complete, removal of photosensitive material in the non-overlapping area along the thickness of the layer of photosensitive material upon the subsequent developing step.

First and second areas of the layer of photosensitive material exposed to radiation may have the same or different physical dimensions (e.g., length, width, absolute area) and/or shapes (e.g., rectangular, circular, ellipsoidal, square, triangular, or any combination of these shapes). In embodiments particularly useful for making T-gate and G-gate electrodes having a selected non-uniform cross-sectional geometry, the first area has a substantially rectangular shape and the second area has a substantially rectangular shape, and optionally the first and second areas have substantially rectangular shapes with high aspect ratios. Substantially rectangular shape refers to shapes that have deviations from an absolute rectangular configuration less than 10% or in some embodiments deviations from an absolute rectangular configuration less than about 1 micron.

The positions of first and second areas of the layer of photosensitive material may be selected/defined relative to each other so as to control the cross-sectional geometry of the structure fabricated by the present methods. In an embodiment, for example, the first and second areas of the layer of photosensitive material are longitudinally aligned and are displaced from each other by a distance selected over the range of about 10 nanometers to about 100 microns. In another embodiment, the second area is smaller than the first area, and the second area is entirely overlapping with the first area.

Radiation exposed to layers of photosensitive material may comprise electromagnetic radiation, including UV and/or visible electromagnetic radiation, and/or electrons, such as electrons provided by a beam of electrons, and/or x-rays. In the present methods, the first intensity exposed to the first area of the layer of photosensitive material and the second intensity exposed to the second area of the layer of photosensitive material may be substantially the same (e.g., within about 10%) or may be different. In some embodiments, the first intensity is provided uniformly across the first area, and wherein the second intensity is provided uniformly across the second area. As will be understood by those having ordinary skill in the art, the steps of exposing the first area of the layer of photosensitive material to radiation having a first intensity and exposing the second area of the layer of photosensitive material to radiation having a second intensity can be carried via a large number of techniques known in the art of lithographic processing. Useful exposure techniques for generating structures having physical dimensions selected with high accuracy and precision include, but are not limited to, electron beam lithography, photolithography, deep ultraviolet light lithography, X-ray lithography, extreme UV lithography, and other next-generation lithography technologies.

In the present methods, selection of the physical dimensions and shapes of first and second areas of the layer of photosensitive material exposed to radiation and selection of the first and second intensities of radiation exposed to first and second areas, respectively, largely controls the physical dimensions and shape of the recessed feature(s) in the layer generated upon developing processing steps. In methods useful for making a structure having a non-uniform cross-sectional geometry, these process parameters are selected such that the depths of the recessed feature(s) having the non-uniform depth profile range from about 10 nanometers to about 10 microns. In some embodiments, these process parameters are selected such that the physical dimensions of the recessed feature(s) are selected from the range of about 10 nanometers to about 100 microns.

Deposition processing steps useful in the present invention include thin film deposition techniques. Useful deposition methods include, but are not limited to, chemical and physical deposition techniques, such as ion beam sputtering, plasma enhanced chemical thin film deposition, electron beam evaporation deposition, thermal evaporation deposition, physical vapor deposition, and chemical vapor deposition. In a method of the present invention, the step of depositing the material comprises the step of depositing one or more thin film layers of material(s) on the layer of photosensitive material having the recessed feature and the exposed region of the substrate, wherein the deposition material(s) is selected from the group consisting of a conductor, a semiconductor and a dielectric material.

As will be understood by one having skill in the art, a wide range of development processing steps are useful in the present invention, including contacting the layer of photosensitive materials with one or more developers (e.g., solvents), liquid phase development techniques, gas phase development techniques, etching development or combinations of these techniques. In an embodiment, the step of removing the layer of photosensitive material lifts off a portion of a deposited thin film layer of material on the layer of photosensitive material having the recessed feature and does not remove at least a portion of the thin film layer of material on the exposed region of the substrate.

The present methods may be used to make a wide range of structures comprising device components for integrated electronic circuits, thin film transistor devices, sensors, semiconductor devices, RF devices, photovoltaic devices, high power devices, memory devices, display devices and light emitting devices. The present invention comprises methods of making FETs and HEMTs, such as Metal-oxide-Semiconductor Field-Effect Transistors (MOSFET), Metal-Semiconductor-Field-Effect Transistors (MESFET), and Junction Field-Effect Transistor (JFET). Methods of the present invention are particularly useful for making electrode structures, such as gate electrode structures including T-gate electrode structures, gamma gate electrode structures and shifted T-gate electrode structures.

In an embodiment useful for making a high performance electrode structure, such as a T-gate or G-gate, the material on the layer of photosensitive material having the recessed feature and on the exposed region of the substrate is one or more conductive materials, such as one or more metals including of aluminum, copper, chromium, nickel, platinum, titanium, tungsten, gold, tin, and zinc. Conductive materials may be deposited in discrete layers or deposited as a single unitary layer. The present invention also includes methods wherein the deposition material is a dielectric material (e.g., metal oxide, polymer material etc.), semiconductor material (e.g., inorganic or organic semiconductor) or a combination of materials selected from the group consisting of a conductor, semiconductor and dielectric. The present invention optionally includes deposition of adhesion layers to enhance the mechanical adhesion of the structure to the substrate, and/or use of additional layers to enhance electrical contact of the structure to the substrate.

Substrates useful in the present invention can be virtually any composition, including wafer substrates, thin film device substrates, flexible substrates, polymer substrates, ceramic substrates and glass substrates. The present methods are compatible with planar substrates and substrates having a contoured surface, such as convex and concave substrates. Useful substrates for the present methods include functional substrates prepatterned with device components, such as a thin film transistor device substrate prepatterned with one or more thin film transistor device components.

Photosensitive materials useful in the present invention include resist materials such as positive resist materials. Exemplary resist materials useful in embodiments of the present invention, include but are not limited to, PMMA, PMGI, i-line resists, DUV resists, etc. In embodiments particularly attractive for providing a high throughput and low cost fabrication platform, a single layer of photosensitive material is used during processing. Selection of the thickness of the layer of photosensitive material controls, in part, the cross-sectional dimensions (e.g., thickness and/or thickness profile) of structures fabricated by the present invention. Methods of the present invention include, but are not limited to, use of layers of photosensitive materials having a thickness selected over the range of about 10 nanometers to about 100 microns.

In another aspect, the present invention provides an electronic device component made by a method comprising the steps of: (i) providing a layer of photosensitive material on at least a portion of a substrate; (ii) exposing a first area of said layer of photosensitive material to radiation having a first intensity; (iii) exposing a second area of said layer of photosensitive material to radiation having a second intensity; wherein said second area of said layer partially overlaps said first area of said layer; (iv) developing said layer of photosensitive material by removing material from said first and second areas, thereby generating a recessed feature in said layer having a non-uniform depth profile, wherein said recessed feature exposes an exposed region of said substrate; (v) depositing a material on said layer of photosensitive material having said recessed feature and on said exposed region of said substrate, and (vi) removing said layer of photosensitive material; thereby making said electronic device component. In an embodiment of this aspect, the material deposited on said layer of photosensitive material and on said exposed region of said substrate is a conductive material, such as one or more thin films of said conductive material. In an embodiment of this aspect, the electronic device component is selected from the group consisting of a gate electrode, a T-gate electrode, gamma gate electrode and a shifted T-gate electrode.

In another aspect, the present invention provides an electronic device made by a method comprising the steps of: (i) providing a layer of photosensitive material on at least a portion of a substrate; (ii) exposing a first area of said layer of photosensitive material to radiation having a first intensity; (iii) exposing a second area of said layer of photosensitive material to radiation having a second intensity; wherein said second area of said layer partially overlaps said first area of said layer; (iv) developing said layer of photosensitive material by removing material from said first and second areas, thereby generating a recessed feature in said layer having a non-uniform depth profile, wherein said recessed feature exposes an exposed region of said substrate; (v) depositing a material on said layer of photosensitive material having said recessed feature and on said exposed region of said substrate; and (vi) removing said layer of photosensitive material; thereby making said electronic device. In an embodiment of this aspect of the present invention, the material deposited on said layer of photosensitive material and on said exposed region of said substrate is one or more materials selected from the group consisting of a conductor, a semiconductor and a dielectric material. In an embodiment of this aspect of the present invention, the electronic device is selected from the group consisting of a thin film transistor, a high electron mobility transistor, and a metal oxide semi-conductor field effect transistor.

BRIEF DESCRIPTION OF THE DRAWINGS

As shown in FIGS. 11A and 11b, the T-gate electrodes have a non-uniform cross-sectional geometry.

DETAILED DESCRIPTION OF THE INVENTION

Figure 1:
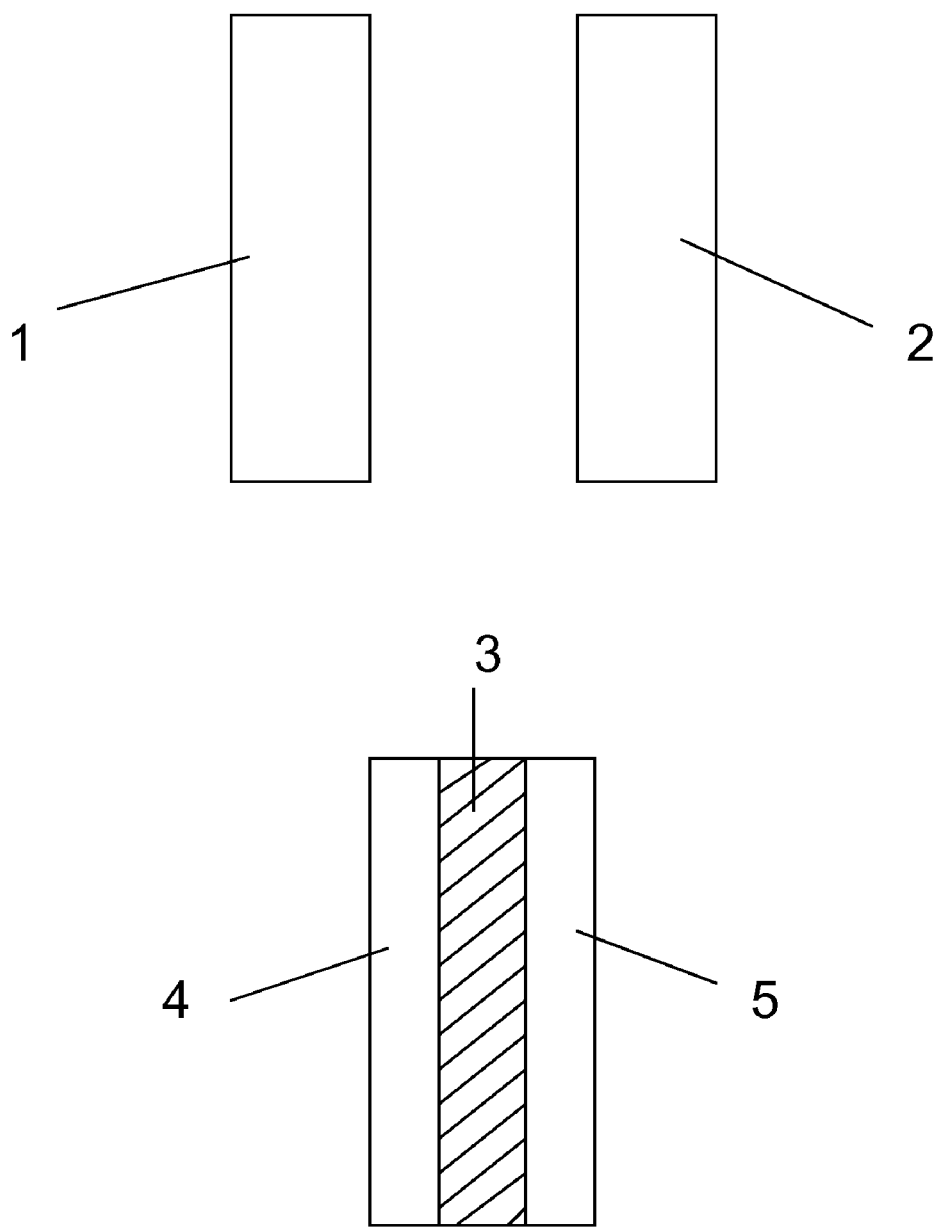
FIG. 1 is an illustration of two identical rectangles that are patterned one on top of another with a slight offset; each rectangle would be patterned with 50% of the required dose. This scheme is used to obtain gates whose gate lengths are half of the length of the rectangles used.

The following definitions apply:

The term "electromagnetic radiation" and "light" are used synonymously in the present description and refer to waves of electric and magnetic fields. Electromagnetic radiation useful for the methods of the present invention include, but is not limited to ultraviolet light, visible light, infrared light, or any combination of these.

"Beam of radiation beam" refers to radiation (electromagnetic radiation or electrons) propagating in substantially the same direction (i.e. beam divergence less than 5 degrees). In the present description, use of the term beam of radiation is intended to be consistent with use of this term in the art of lithographic processing. Beams of electromagnetic radiation beam useful in the methods of the present invention include beams of electromagnetic radiation, electron beams and X-ray beams.

"Lift-off" refers to a substrate processing step wherein material is removed by removing a sacrificial layer, such as a layer of photosensitive material (e.g. photoresist layer), provided underneath the material to be removed and supported by the substrate.

The terms "intensity" and "intensities" refer to the time average energy flux of a beam of electromagnetic radiation or beam of electrons, for example the number of photons or electrons per square centimeter per unit time, or the net number of photons or electrons per square centimeter for a specified time interval. In the context of an intensity of electromagnetic radiation, the term "intensity" may refer to the square of the amplitude of an electromagnetic wave or plurality of electromagnetic waves. The term amplitude in this context refers to the magnitude of an oscillation of an electromagnetic wave.

The expression "non-uniform depth profile" refers to recessed features of the present invention wherein the depth of the recessed features varies in one or two spatial dimensions (e.g. longitudinal and/or lateral dimensions such as length and width). In some embodiments, recessed features in a layer of photosensitive material having a non-uniform depth profile are generated in the present methods wherein some portions of the recessed feature extend the entire thickness of the layer of photosensitive material and other portions of the recessed feature do not extend the entire thickness of the layer of photosensitive material. Recessed features having a non-uniform depth profile are useful in methods of the present invention for making structures having non-uniform cross-sectional geometries including, but not limited to, electrode structures such as T-gate electrodes, shifted T-gate electrodes and Gamma gate electrodes.

The expression non-uniform cross-sectional geometry refers to a structure having a cross sectional dimension, such as thickness, that varies in one or two spatial dimensions (e.g. longitudinal and/or lateral dimensions such as length and width). Structures having a non-uniform cross-sectional geometry of the present invention include thin film structures wherein the thickness of the structure varies along the length and/or width of the structure. Structures having a non-uniform cross-sectional geometry of the present invention include thin film structures wherein the cross sectional profile of the structure is not uniform along the length and/or width of the structure. Structures having a non-uniform cross-sectional geometry of the present invention include, but are not limited to, electrode structures such as T-gate electrodes, shifted T-gate electrodes and Gamma gate electrodes In the following description, numerous specific details of the devices, device components and methods of the present invention are set forth in order to provide a thorough explanation of the precise nature of the invention. It will be apparent, however, to those of skill in the art that the invention can be practiced without these specific details.

The present invention provides methods for making structures on substrate surfaces, including structures having a non-uniform cross-sectional geometry. The present methods are particularly attractive for high-throughput, low cost fabrication and integration of electrodes, such as T-gate and G-gate electrodes, for FETs and devices comprising FETs.

The description that follows provides an explanation of an embodiment of the present invention useful for making a T-gate electrode structure having a non-uniform cross-sectional geometry. For the purpose of this description, we assume that the total dose required for complete removal of a portion or area of the exposed layer of photosensitive material (i.e., removal extending along the entire thickness of the layer), hereafter referred to and exemplified as a "photoresist", "resist" or "positive resist", upon development is a 100% dose. Accordingly, a dose of less than 100% results in incomplete removal of the exposed layer of photosensitive material (i.e., material removal not extending along the entire along the entire thickness of the layer). For the sake of clarity, the convention "XXX % dose" refers to a dose of radiation referenced relative to the 100% dose, thus a 50% dose is 50% of a 100% dose, a 20% dose is 20% of a 100% dose and so forth.

In an embodiment of the fabrication methods of the present invention, a high molecular weight photoresist is first applied on the substrate. The photoresist is subsequently baked to stabilize this layer so as to allow subsequent high resolution lithographic patterning. After baking, the photoresist is exposed to an intensity of radiation using one of the methods described above. In the case of electron beam lithography (EBL), a first rectangle (i.e., the first area of the photoresist layer) of selected dimensions is patterned into the photoresist layer via exposure of a selected area to a selected intensity of electrons. In an embodiment, for example, this first pattern is written with 50% of the required dose. Once the first rectangle is patterned, a second rectangle (i.e., the second area of the photoresist layer) of the same length and width is patterned via exposure of a selected area also using 50% of the required dose. The second rectangle patterned into the photoresist is selectively positioned such that it partially overlaps the first rectangle. In an embodiment, for example, the second rectangle is positioned to overlap the first, such that it covers half its area. Accordingly, the overlapping portion of both rectangles will receive the required 100% dose for development. The portions of the two rectangles that are not overlapping, on the other hand, received only 50% of the required dose.

After patterning via exposure of selected areas of the photoresist to first and second intensity of electrons to first and second areas of the photoresist, the patterned photoresist layer is developed. During development, only areas of the photoresist that received the required 100% of the dose are entirely removed along the entire thickness of the photoresist layer. In contrast, areas the photoresist that received only 50% of the required dose are lowered via material removal to half, more than half or less than half of its height depending on the contrast of the developer and the properties of the resist. The contrast of the developer can be controlled in the present invention chemically and/or thermally. After development, metal is deposited on the resist having a recessed feature generated during development processing. In some embodiments, a thin film of metal is deposited on the developed photoresist layer. The sample is then contacted with a stripper solution which dissolves all of the photoresist layer, optionally causing materials lift off of portions of the deposited metal that are provided to regions of the photoresist other than the recessed feature. In some embodiments, the resulting metal structure is a T-gate, wherein the overlapping portion of the two rectangles forms the gate length for the T-gate structure.

Patterning of the photoresist layer is carried out in some embodiments of the present invention using Sub Pixel Voting (SPV) technique when implemented with a maskless system using a Spatial Light Modulator (SLM). U.S. Pat. No. 6,717,650, issued Apr. 6, 2004, describes exemplary methods of maskless lithography via sub pixel voting useful for methods of the present invention, which is hereby incorporated by reference to the extent not inconsistent with the description herein. In these embodiments, the first rectangle (i.e. first area of the photoresist layer) is patterned into the photoresist layer with a 50% dose by turning 'on' the required pixels. The stage then moves by the required distance and the second rectangle (i.e. second area of the photoresist layer) is patterned into the photoresist layer with a 50% dose such that it partially overlaps the first rectangle. The sample is then developed and metal is deposited, for example, a thin metal film is deposited. After the photoresist is stripped, a T-Gate structure is fabricated. An important benefit of this embodiment is that even though two different rectangles are being written into the photoresist layer, the writing time remains unaffected because the dose for each is lowered by half.

A major advantage provided by the use of Sub Pixel Voting patterning techniques in the present invention is that instead of making the second rectangle cover half the area of the first rectangle; this techniques easily allows the second rectangle to overlap the first rectangle for any desired overlap area, e.g. 25%, 10%, etc. The overlapping region that forms the gate length can be controlled with a high degree of precision by selection of the relative positioning of the rectangles with each other. Thus, the present invention can be used to pattern sub 100 nm T-gates with relative ease.

The present invention is also capable of fabricating Gamma gates and Shifted T-gates. Both rectangles also need not be of the same dimensions, e.g.: the length of one could be less than the other in order to obtain shifted T-Gates and Gamma Gates.

T-Gates, Gamma Gates, Shifted T-Gates and other such structures can be patterned by using any of the above mentioned Lithography techniques (EBL, DUV etc). Doses of less than or more than 50% can also be employed in realizing such structures. Doses of less than 50% improves writing time in some embodiments.

The present invention is also capable of achieving the T-Gate profile in the photoresist by first writing a rectangle of a certain dimensions (e.g., shape and area) with a 50% dose. Next, another rectangle is patterned with a 100% dose followed by patterning another rectangle using a 50% dose. In this embodiment, the rectangle written with a 100% dose will defines the stem (or foot) of the T-Gate. This provides a fabrication pathway to the T-Gate structure.

In another embodiment, a large rectangle of certain dimensions is patterned using a 50% does and then a smaller rectangle (smaller in length) is patterned such that it overlaps the larger rectangle. The smaller rectangle is also patterned using a 50% does. An advantage of this embodiment is that it decreases the writing time when carried out using EBL.

The use of 50% and 100% doses in the description above are purely for the purpose of exemplifying the present invention. As will be understood by persons having skill in the art, doses other than 100% and 50% can be used in the present invention. For example, doses of 5%, 10%, 15%, 20%, 25%, 30%, 35%, 40%, 45%, 50%, 55%, 60%, 65%, 70%, 75%, 80%, 85%, 90% and 95% are useful in some embodiments of the present invention.

An advantage of some embodiments of the present invention is that it makes use of only one layer of resist. This attribute of the present invention is beneficial because it reduces the complexity in making the above mentioned structures and significantly cuts the cost of purchasing additional resists and developers for the resists, that are required in processing techniques using a multilayer resist protocol.

When T-Gates are patterned with EBL, even though two overlapping rectangles are being patterned such that the second rectangle covers half the area of the first, there will be no change in the writing time because the dose of each rectangle is 50% of the required dose. Hence, the throughput of patterning gates is not affected. When used with mask less lithography the present methods increase the throughput manifold relative to convention processing methods.

In using EBL and maskless lithography with SPV, note that no additional alignment requirement is presented for aligning the stem with the tee-top. This is so because no masks are used and the wafer does not have to be positioned a second time.

In some embodiments, the present methods make uses of a single developer. Alternatively, a combination of two or more developers can be used in the present methods. In an embodiment, the first developer is very highly concentrated and dissolves the resist in the exposed regions. The sample is then placed in a second high contrast developer to improve the contrast and result in the desired T-Gate or Gamma Gate. In some embodiments, however, a single developer is used during processing to keep costs down.

The present invention is further described by reference to the following drawings. As will be understood by one of skill in the art, theses drawings and this description are provided to exemplify specific embodiments of the present invention and does not limit the scope of claim subject matter.

Figure 2:
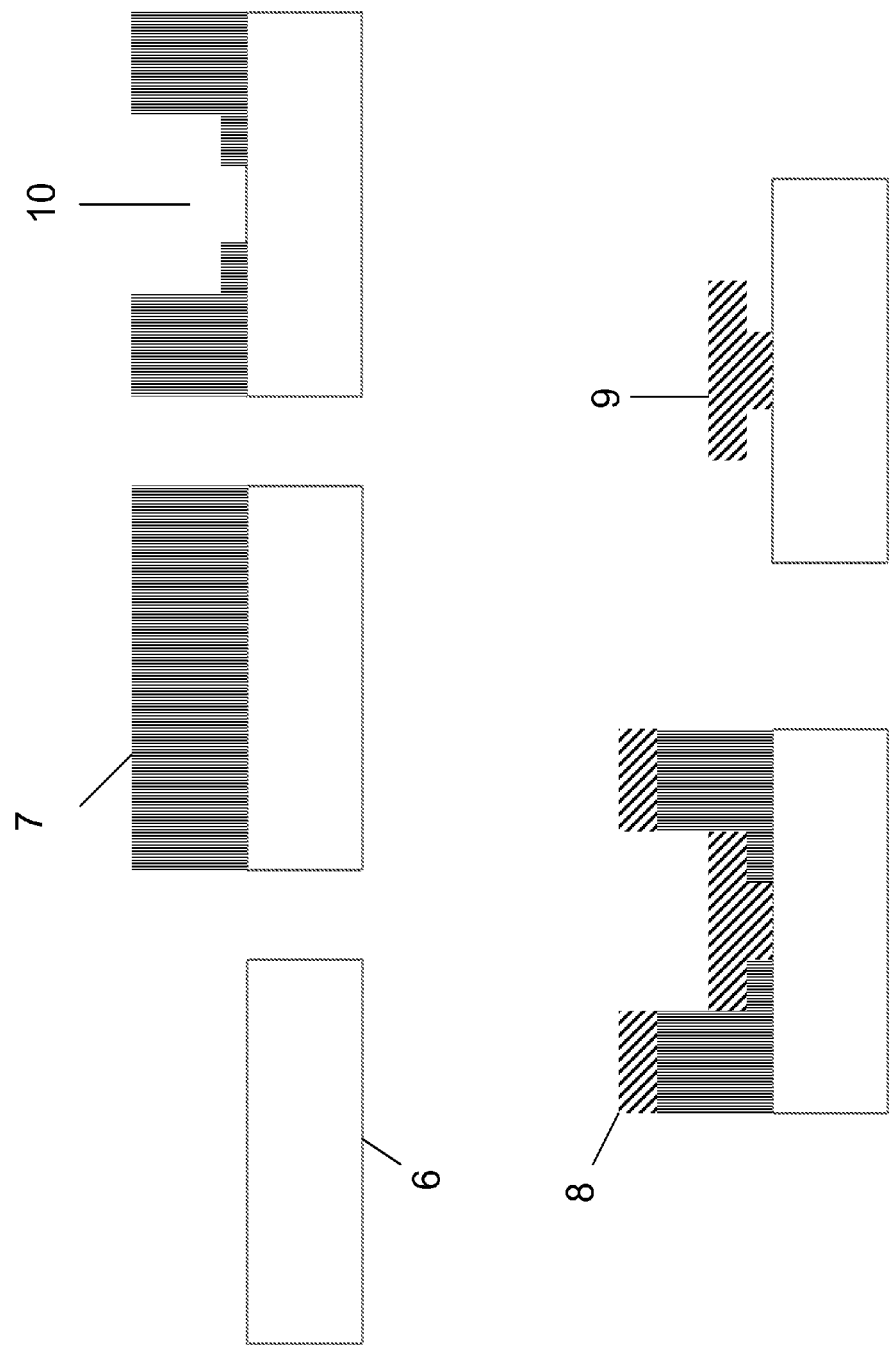
FIG. 2 shows the processing steps in obtaining a T-gate whose gate length is half of the length of the rectangles used.

FIG. 1 provides a top plan view showing two rectangles 1, 2 of equal dimensions and areas are patterned by any of the above mentioned Lithography techniques to obtain a T-Gate. Referring to FIG. 2, a cross-sectional view is provided showing a resist layer 7 is first deposited on a substrate 6. The rectangles 1, 2 are made to overlap such that rectangle 1 covers half the area of rectangle 2. Both rectangles 1, 2 are patterned using a 50% dose. The overlapping region of both rectangles is denoted by drawing element 3 in FIG. 1; the area corresponding to overlapping region 3 receives the required 100% dose and will form the gate region. The regions that receive 50% dose are denoted by drawing elements 4 and 5 in FIG. 1. Once the patterning is completed and the sample is developed, the areas that received 50% of the dose are reduced to half or lower than half of the original thickness of resist layer 7. As shown in FIG. 2, development processing generates a recessed feature 10 having a non-uniform depth profile. Metal layer 8 is then deposited on the sample, for example by deposition of a thin film of metal. The sample is then subsequently made to react (e.g., contacted with) with a stripper solution. Once all the resist 7 has dissolved in the stripper solution, a T-Gate structure 9 made of metal 8 remains (See FIG. 2). As shown in FIG. 2, structure 9 has a non-uniform cross sectional geometry that is T shaped.

Figure 3:
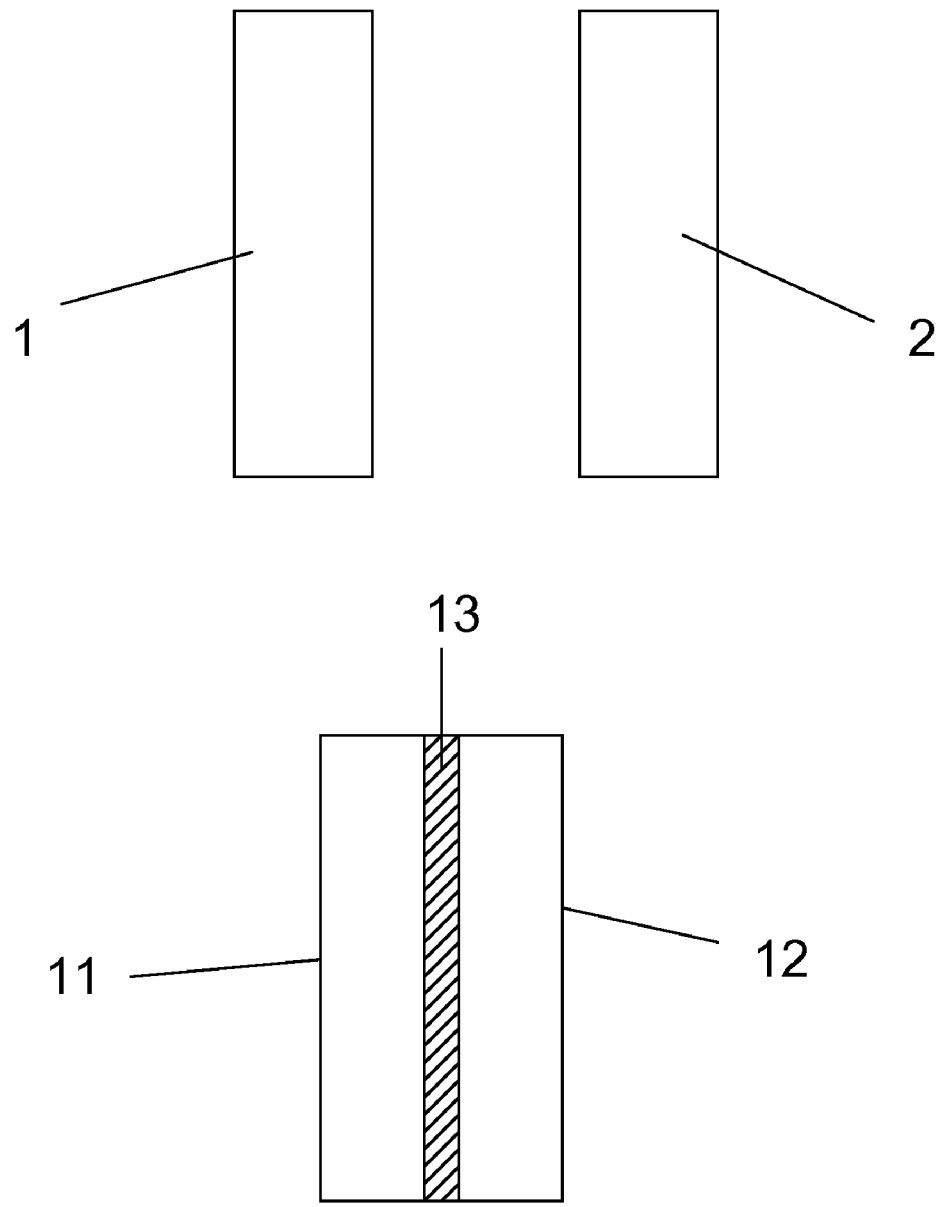
FIG. 3 is an illustration of two identical rectangles that are patterned one on top of another with an offset; each rectangle would be patterned with 50% of the required dose. This scheme is used to obtain T-gates of any desired gate length.
Figure 4:
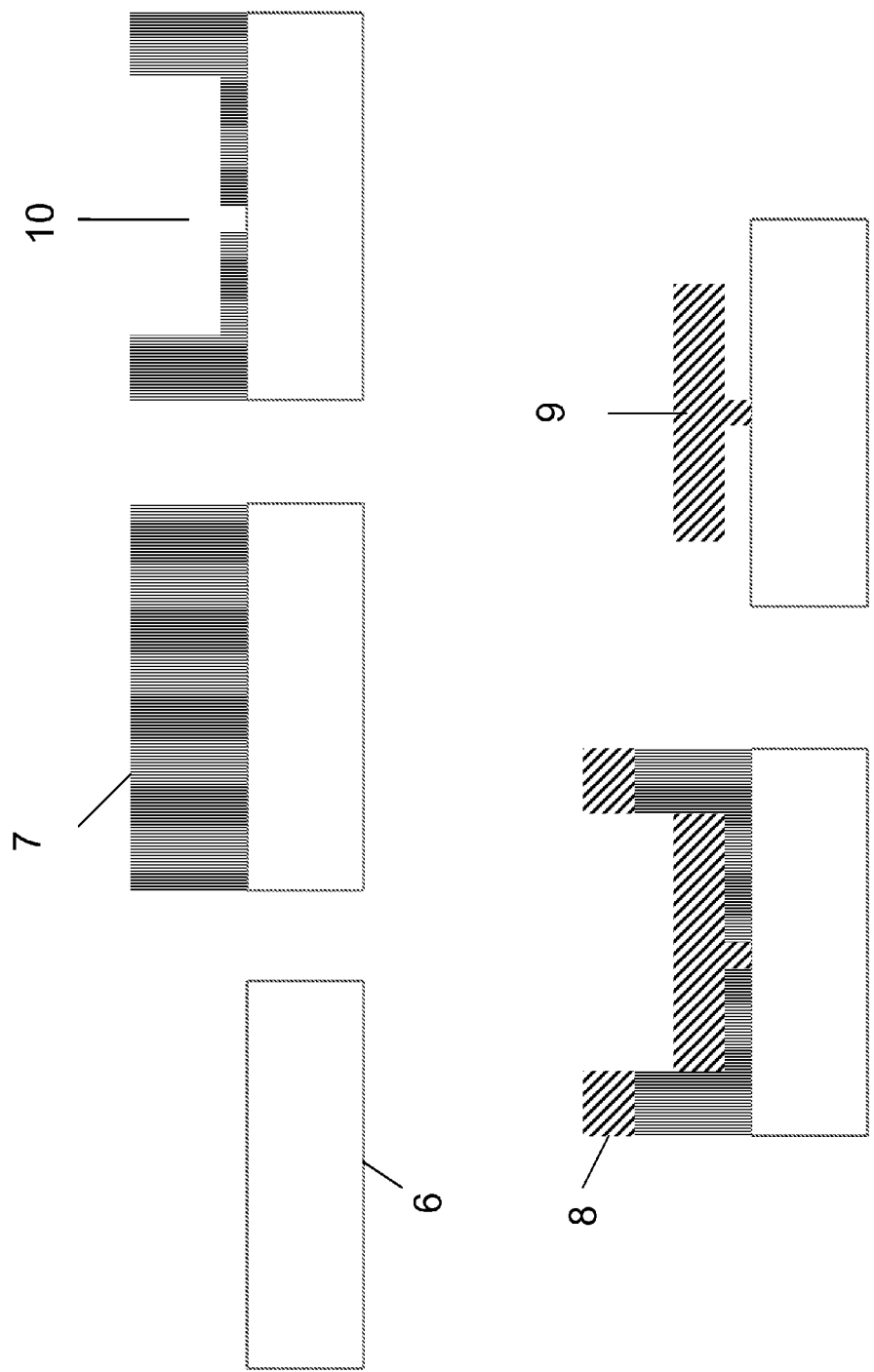
FIG. 4 shows the processing steps in obtaining a T-gate of any desired gate length.

FIG. 3 shows that two rectangles 1, 2 of equal dimensions and areas are patterned by any of the above mentioned Lithography techniques to obtain a T-Gate of any desired gate length. As seen in FIG. 4, a resist layer 7 is first deposited on a substrate 6. The rectangles 1, 2 are made to overlap such that overlapping region forms the gate region. Both 1, 2 are patterned with 50% dose. The overlapping region of both rectangles is shown by 13 in FIG. 3; this area received the required 100% dose. The regions that receive 50% dose are denoted by 11 and 12. Once the patterning is completed and the sample is developed, the areas that received 50% of the dose are reduced to half or lower than half of the original thickness of resist layer 7. As shown in FIG. 4, development processing generates a recessed feature 10 having a non-uniform depth profile. Metal layer 8 is then deposited on the sample. The sample is then subsequently made to react with a stripper solution. Once all the resist 7 has dissolved in the stripper solution, a T-Gate structure 9 made of metal 8 remains (See FIG. 4). As shown in FIG. 4, structure 9 has a non-uniform cross sectional geometry that is T shaped.

Figure 5:
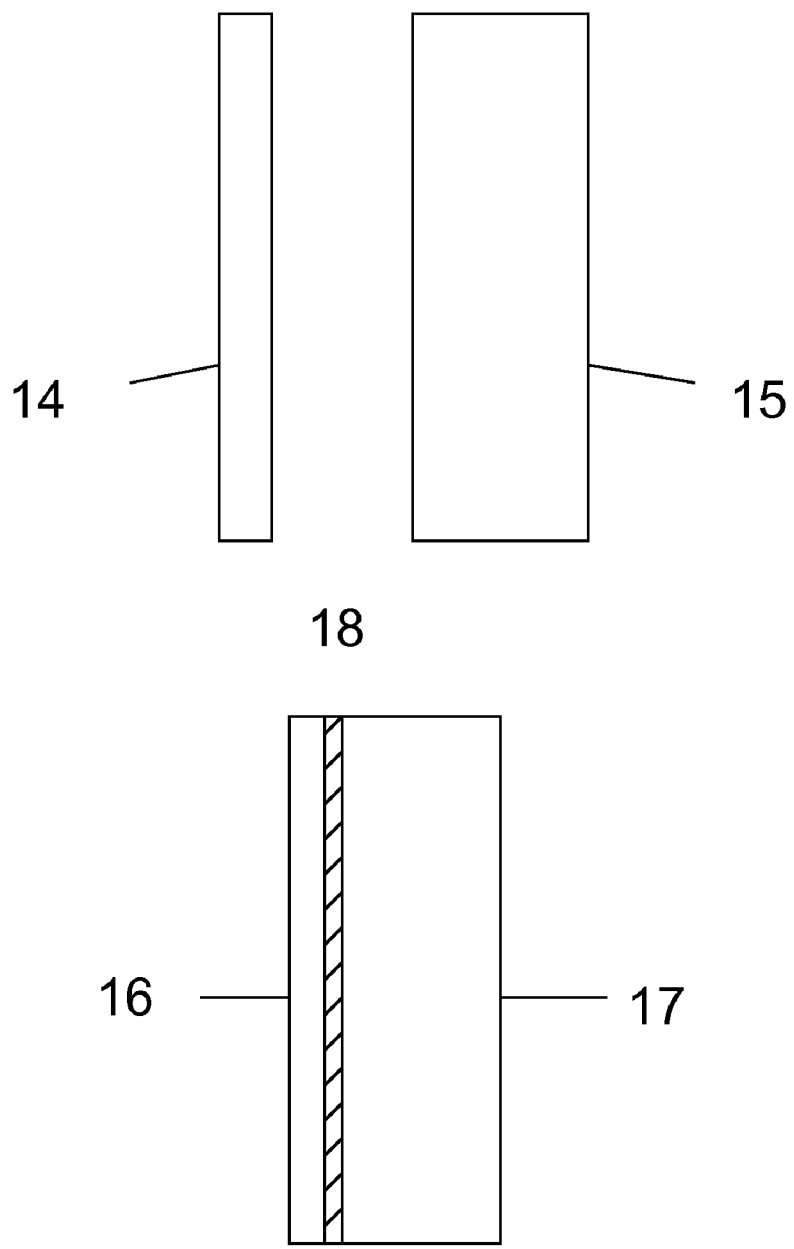
FIG. 5 is an illustration of two dissimilar rectangles that are patterned one on top of another with a slight offset; each rectangle would be patterned with 50% of the required dose. This scheme is used to obtain Shifted T-gates and Gamma gates of any desired gate length.
Figure 6:
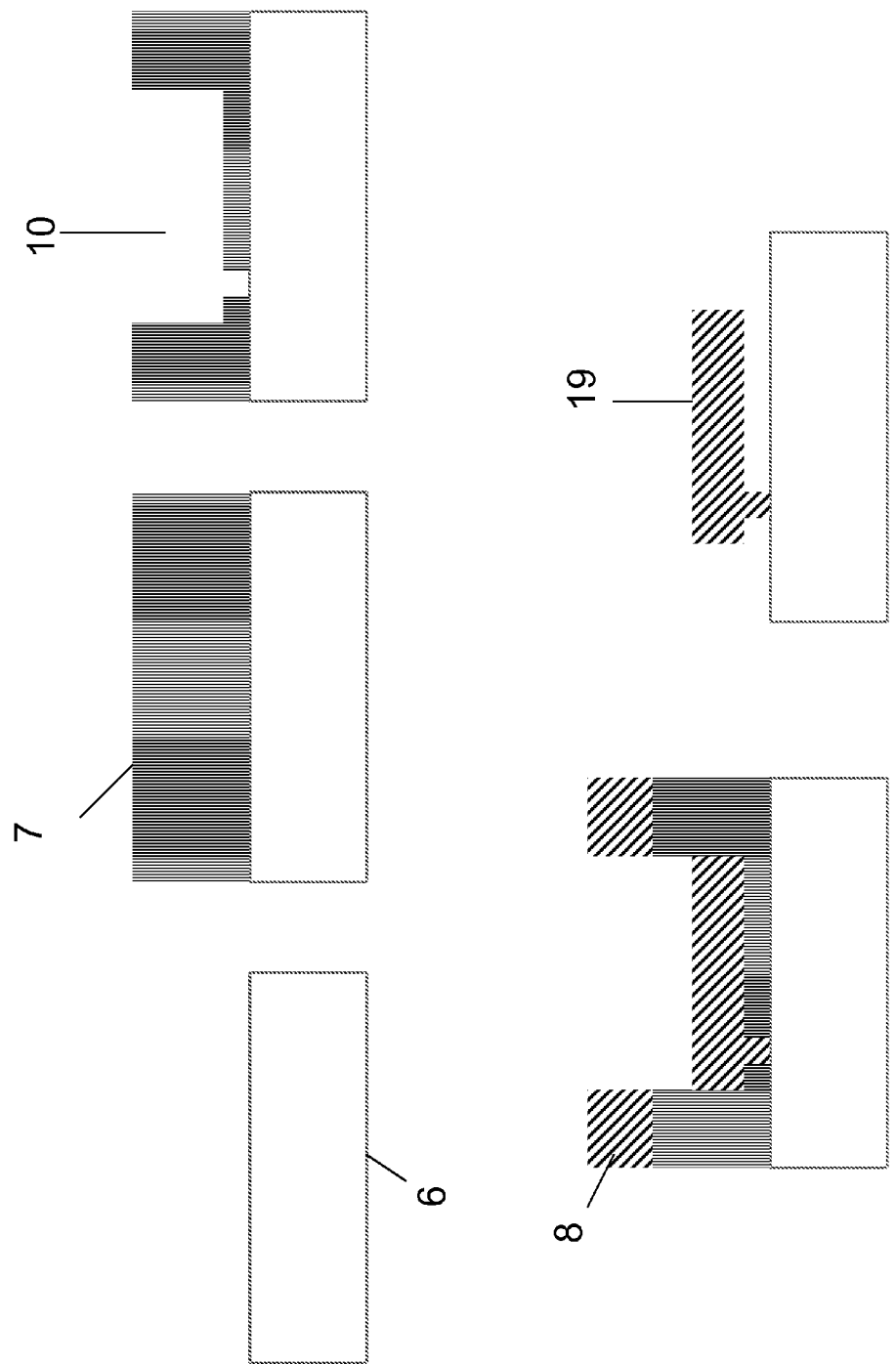
FIG. 6 shows the processing steps in obtaining Shifted T-gates and Gamma gates of any desired gate length and dimension.

FIG. 5 shows that two rectangles 14, 15 of unequal dimensions and areas are patterned by any of the above mentioned Lithography techniques to obtain a Gamma Gate. As seen in FIG. 6 a resist layer 7 is first deposited on a substrate 6. The rectangles 14, and 15 are made to overlap such that the overlapping region 18 forms the gate region (See, FIG. 6). Both rectangles 14 and 15 are patterned with 50% dose. The overlapping region of both rectangles is depicted by drawing element 18; this area receives the required 100% dose. The regions that receive 50% dose are denoted by 16 and 17 (See FIG. 5). Once the patterning is completed and the sample is developed, the areas that received 50% of the dose are reduced to half or lower than half of the original thickness of resist layer 7. As shown in FIG. 6, development processing generates a recessed feature 10 having a non-uniform depth profile. Metal layer 8 is then deposited on the sample. The sample is then subsequently made to react with a stripper solution. Once all the resist 7 has dissolved in the stripper solution, a Gamma Gate structure 19 made of metal 8 remains (See, FIG. 6). As shown in FIG. 6, structure 19 has a non-uniform cross sectional geometry that is T shaped wherein the stem of the T is shifted away from the center of the tee.

Figure 7:
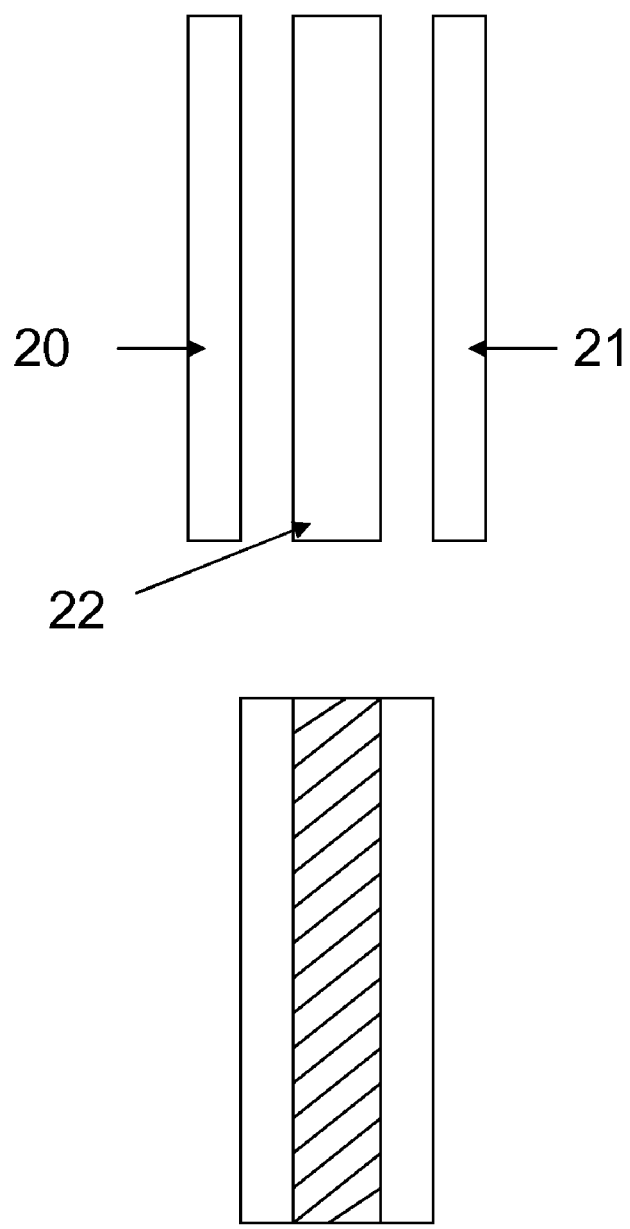
FIG. 7 is an illustration of how a T-gate can be obtained without overlapping, however, it uses partial doses.
Figure 8:
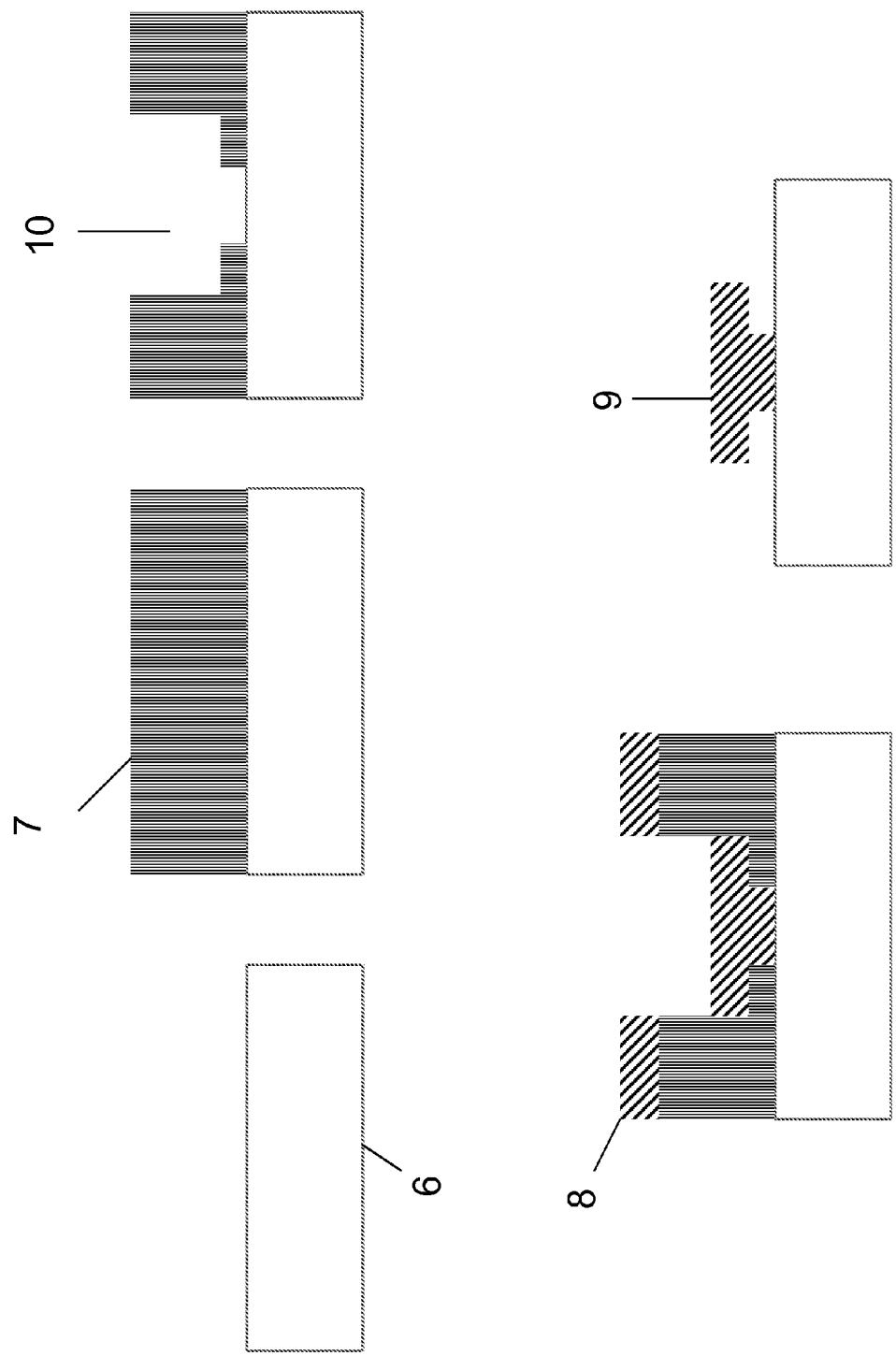
FIG. 8 shows the processing steps in obtaining a T-gate without overlapping. Only partial doses are employed.

FIG. 7 shows that three rectangles 20, 21, and 22 are patterned by any of the above mentioned Lithography techniques to obtain a T-Gate. Rectangles 20 and 21 are patterned with 50% dose while the area of rectangle 22 is patterned with 100% dose. The processing steps shown in FIG. 8 are similar to those shown in FIG. 2. As shown in FIG. 8, structure 9 has a non-uniform cross sectional geometry that is T shaped.

Figure 9:
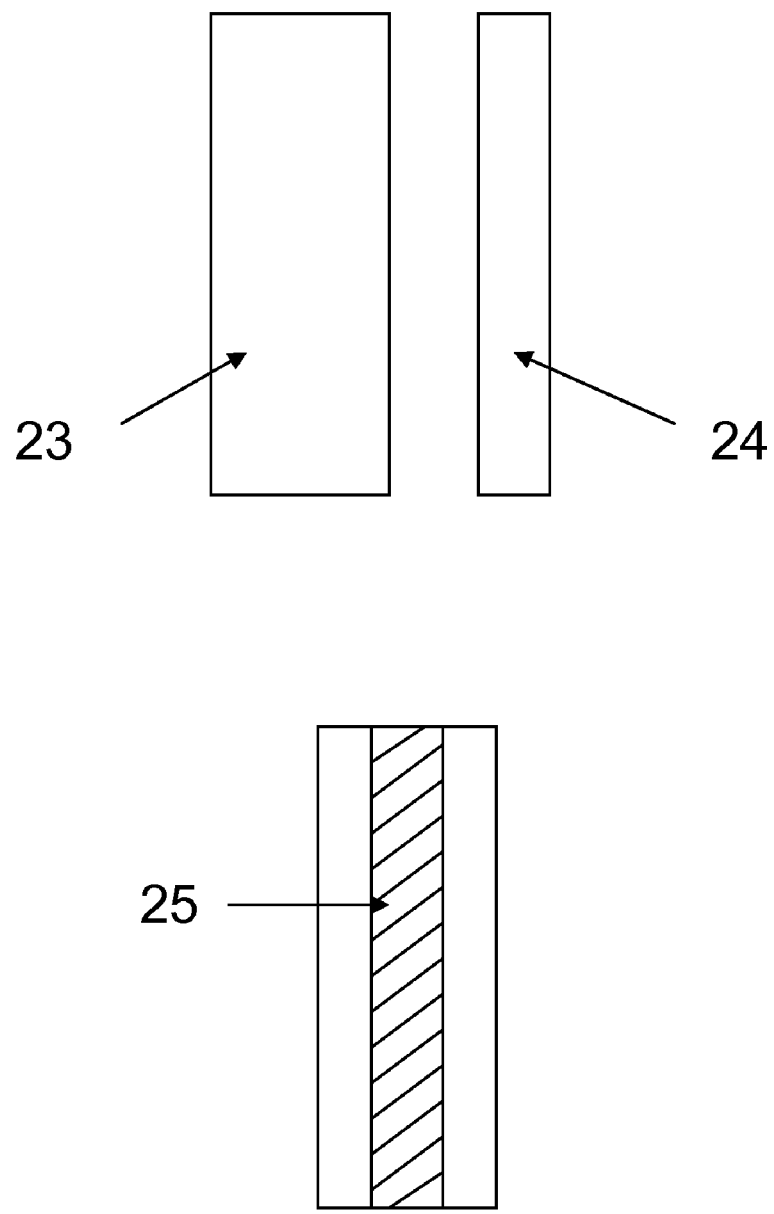
FIG. 9 is an illustration of how a T-gate can be obtained by overlapping with an overlapping scheme different from that in FIGS. 1-8.
Figure 10:
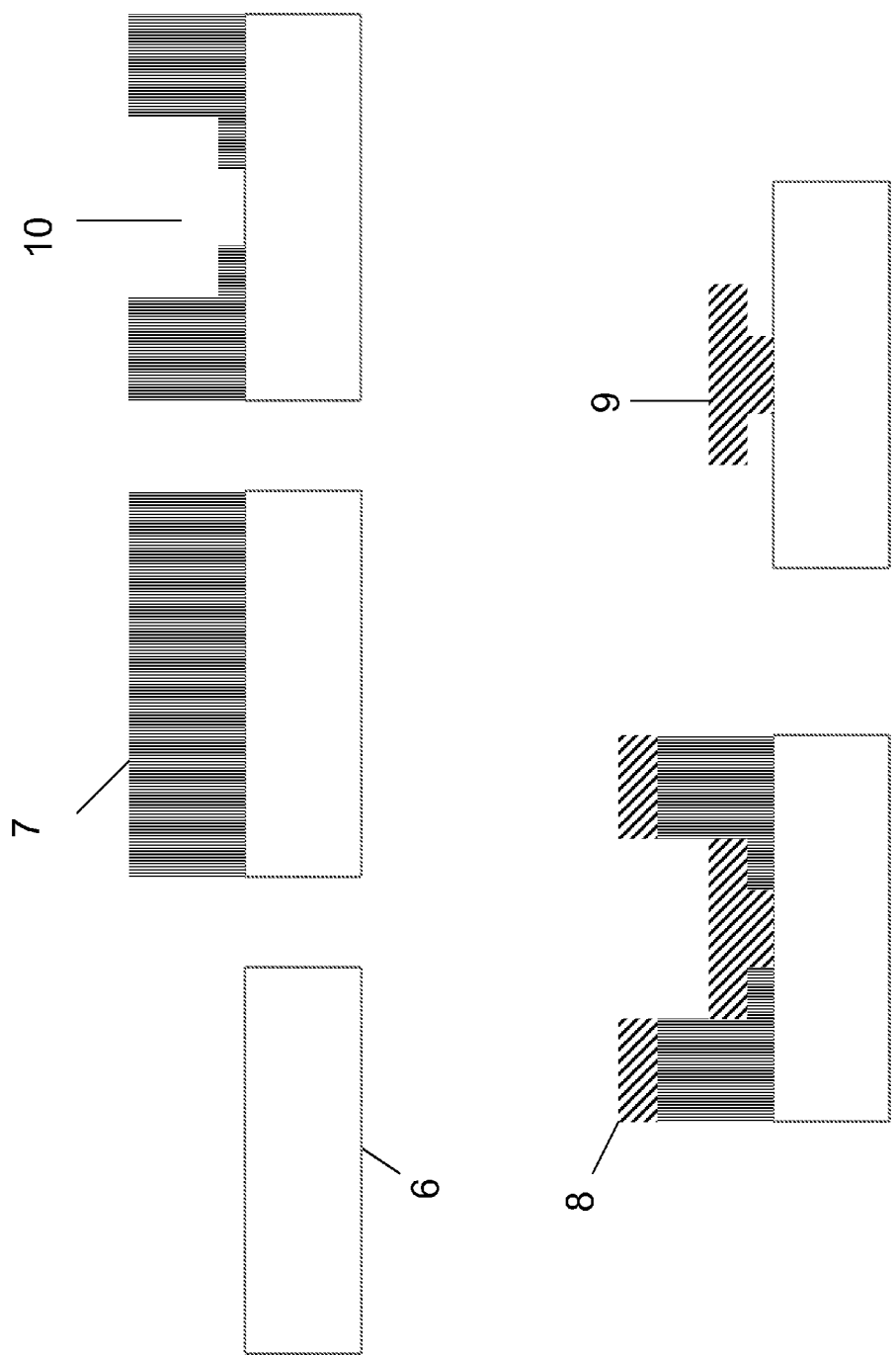
FIG. 10 shows the processing steps in obtaining a T-gate with the overlapping scheme of FIG. 9.

FIG. 9 shows that two rectangles 23 and 24 of unequal dimensions are used to pattern a T-Gate. Rectangle 24 is made to completely overlap 23. Both rectangles are patterned with 100% dose such that the area of overlapping portion 25 gets the required 100% dose for development. The processing steps of obtaining a T-Gate given in FIG. 10 are the same as the steps given in FIG. 2. As shown in FIG. 10, structure 9 has a non-uniform cross sectional geometry that is T shaped. This technique helps cut the 'writing' time, thereby increasing throughput and lowering cost.

Example 1

Fabrication of a T-Gate Structure for a HEMT Device

This example demonstrates the patterning a T-Gate structure which acts as the Schottky contact for a GaN/AlGaN HEMT structure using the methods of the present invention. The patterning of the gate is one of the most important steps for device performance and is usually patterned at the very end after the rest of the processing has been completed.

A 7000 Å layer of PMMA is spun on the substrate using certain spin speed and spin time. The substrate having the PMMA layer is exposed to an electron beam, which first writes a rectangle having a length of 150 nm at a dose of 50%. Another rectangle having a length of 150 nm is subsequently written such that it partially overlaps the first rectangle. The second rectangle is written with a 50% dose and covers half the area of the first rectangle. The sample is developed in MIBK: IPA (1:3). The exposed regions dissolve in the developer. About 250 Å of Nickel and 3000 Å of Gold are deposited by evaporation. Nickel acts as the Schottky metal and Gold helps reduce the Gate resistance because of its high conductivity. The substrate is then dropped in a solution of Methanol: Methyl Chloride (1:1) which is a stripper solution for PMMA. Once all the PMMA has dissolved we obtain a T-Gate structure of gate length 75 nm.

Figure 11A:
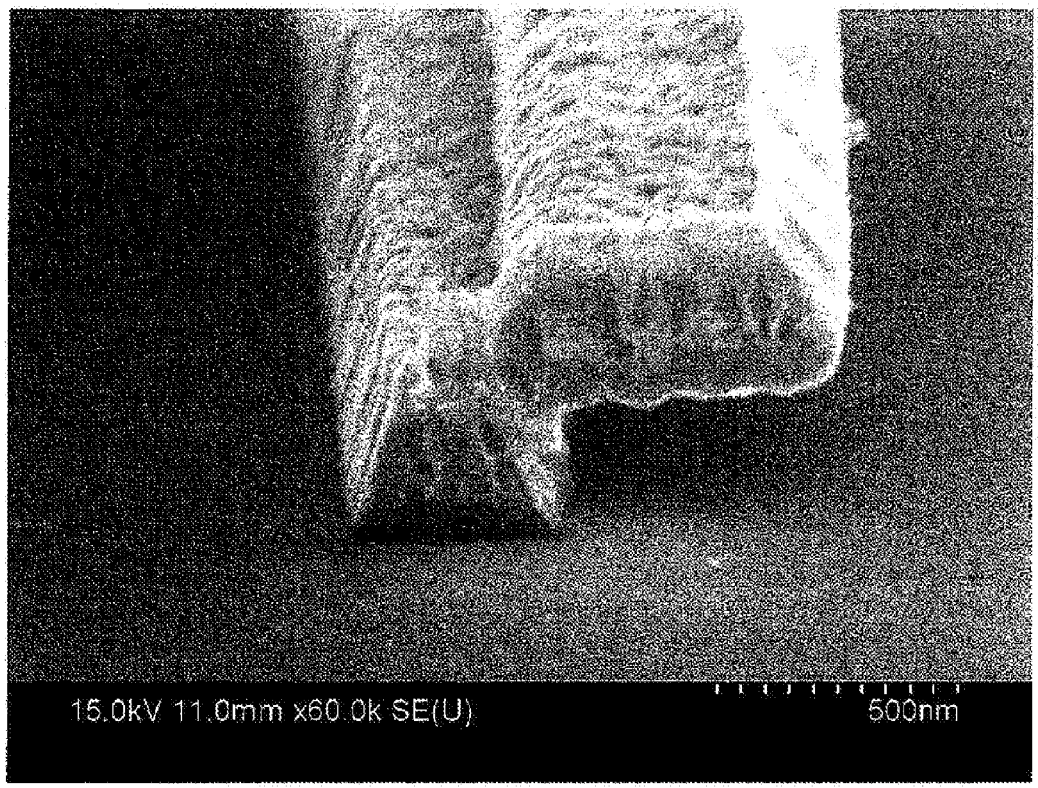
FIGS. 11A and 11b provides SEM micrographs showing a T-gate electrode made by the methods of the present invention.
Figure 11B:
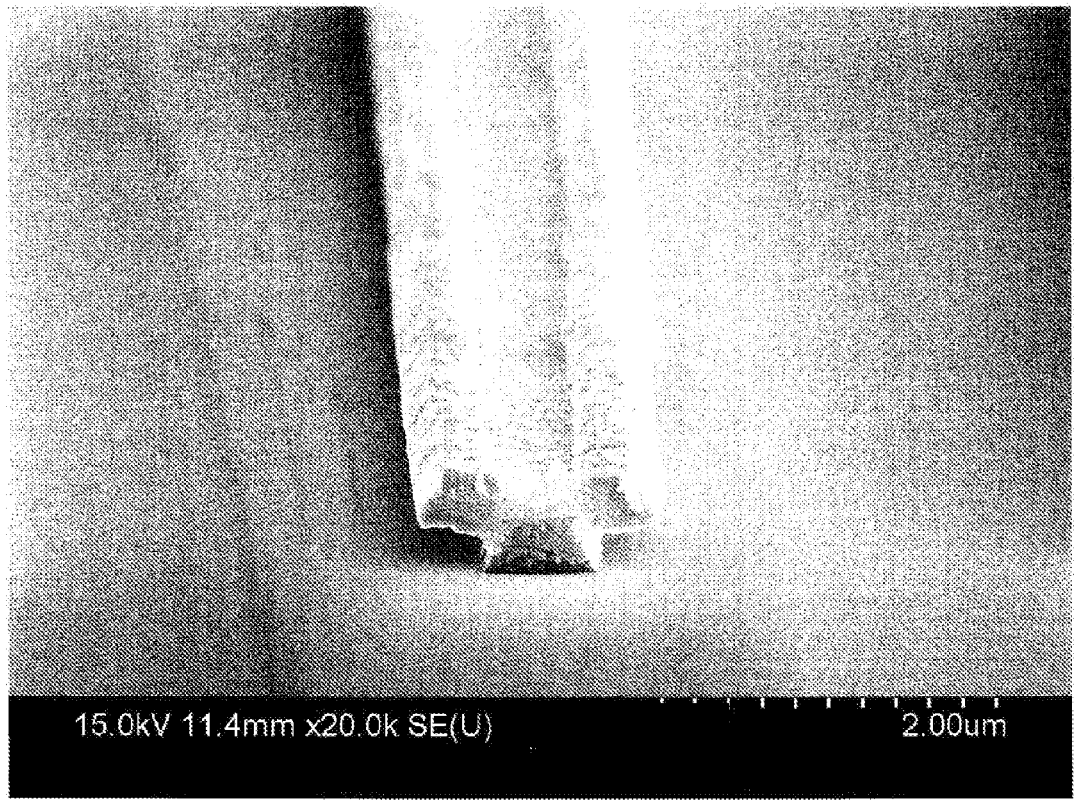

FIGS. 11A and 11b provides SEM (scanning electron microscope) micrographs showing a T-gate electrode made by the methods of the present invention. As shown in FIGS. 11A and 11b, the T-gate electrodes have a non-uniform cross-sectional geometry. The structure shown in FIG. 11A was fabricated as follows. A 7000 Angstrom thick layer of PMMA was first spun on a silicon wafer. The wafer was then exposed to an E-beam by which two rectangles of different sizes were made to overlap such that the overlapping region formed the foot of the gate. The two rectangles were each patterned with 50% dose so that the overlapping region received 100% dose. Once patterning was completed, the sample was developed in a developer comprising a 1:2 mixture of MIBK and IPA. After developing, layers of 2200 Angstroms of titanium and 1000 Angstroms of gold were deposited via evaporation on to the sample. The sample was then dipped in 1:1 mixture of methyl chloride and methanol which dissolves the resist. The metal structure that is left behind is a Gamma Gate as seen in FIG. 11A. The structure in FIG. 11B was fabricated by the same processes as used for fabricating the structure of FIG. 11A, except that the rectangles were of the same size, thereby resulting in formation of a T-gate structure.

STATEMENTS REGARDING INCORPORATION BY REFERENCE AND VARIATIONS

All references cited throughout this application, for example patent documents including issued or granted patents or equivalents; patent application publications; and non-patent literature documents or other source material are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

Every formulation or combination of components described or exemplified herein can be used to practice the invention, unless otherwise stated.

Whenever a range is given in the specification, for example, a temperature range, a time range, or a composition or concentration range, all intermediate ranges and subranges, as well as all individual values included in the ranges given are intended to be included in the disclosure. It will be understood that any subranges or individual values in a range or subrange that are included in the description herein can be excluded from the claims herein.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

One of ordinary skill in the art will appreciate that starting materials, materials, reagents, synthetic methods, purification methods, analytical methods, assay methods, and methods other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

We claim:

1. A method for making a T-gate, shifted T-gate or Gamma gate electrode structure on a substrate, said method comprising the steps of:
    providing a layer of photosensitive material on at least a portion of said substrate, said layer of photosensitive material having a thickness;
    exposing a first area of said layer of photosensitive material to radiation having a first intensity;
    exposing a second area of said layer of photosensitive material to a second radiation having a second intensity; wherein said second area of said layer partially overlaps said first area of said layer in an overlapping area;
    developing said layer of photosensitive material by removing said photosensitive material from said first and second areas, wherein said photosensitive material is completely removed along the entire thickness of the layer of photosensitive material for the overlapping area so as to expose an exposed region of the substrate and wherein said photosensitive material is only partially removed along the thickness of the layer of photosensitive material for non-overlapping areas of the first and second areas, thereby generating a recessed feature in said layer of photosensitive material having a non-uniform depth profile, wherein said recessed feature includes a first feature with a first length corresponding to both the first area and the second area and a second feature with a second length corresponding to the overlapping area, wherein said second feature of the recessed feature exposes the exposed region of said substrate;
    depositing a material on said layer of photosensitive material having said recessed feature and on said exposed region of said substrate so as to at least partially fill said recessed feature, thereby generating said structure of said material having a selected non-uniform cross sectional geometry corresponding to the non-uniform depth profile in said photosensitive layer, said structure having a stem portion in contact with the substrate corresponding to the second feature and a top portion corresponding to the first feature; and
    removing said layer of photosensitive material; thereby making said T-gate, shifted T-gate or Gamma gate electrode structure on said substrate.

2. The method of claim 1 wherein said photosensitive material is a positive photoresist material.

3. The method of claim 1 wherein a single layer of said photosensitive material is used in said method.

4. The method of claim 1 wherein said first and second intensities are large enough such that said overlapping area is exposed to a net intensity of radiation large enough to provide complete removal of said photosensitive material in said overlapping area along the entire thickness of said layer of photosensitive material upon said developing step.

5. The method of claim 1 wherein portions of said first area and said second area do not overlap in said non-overlapping areas; wherein said first and said second intensities are each low enough such that said non-overlapping areas exposed to said intensities of said first and said second radiation that provide partial removal of said photosensitive material in said non-overlapping areas along the thickness of said layer of photosensitive material upon said developing step.

6. The method of claim 1 wherein between about 10% to about 90% of said first area of said layer of photosensitive material overlaps with said second area of said layer of photosensitive material.

7. The method of claim 1 wherein between about 10% to about 90% of said second area of said layer of photosensitive material overlaps with said first area of said layer of photosensitive material.

8. The method of claim 1 wherein said first area has a substantially rectangular shape and said second area has a substantially rectangular shape.

9. The method of claim 8 wherein said first and second areas have substantially rectangular shapes with high aspect ratios.

10. The method of claim 8 wherein said first and second areas of said layer of photosensitive material have the same physical dimensions.

11. The method of claim 8 wherein said first and second areas of said layer of photosensitive material are longitudinally aligned and are displaced from each other by a distance selected over the range of about 10 nanometers to about 100 microns.

12. The method of claim 1 wherein said second area is smaller than said first area, and wherein said second area is entirely overlapping with said first area.

13. The method of claim 1 wherein said first intensity and said second intensity are substantially the same.

14. The method of claim 1 wherein said first intensity is provided uniformly across said first area, and wherein said second intensity is provided uniformly across said second area.

15. The method of claim 1 wherein said layer of photosensitive material has a thickness selected over the range of about 10 nanometers to about 100 microns.

16. The method of claim 1 wherein said recessed feature having said non-uniform depth profile has depths which range from about 10 nanometers to about 10 microns.

17. The method of claim 1 wherein said recessed feature has physical dimensions selected from the range of about 10 nanometers to about 100 microns.

18. The method of claim 1 wherein said material deposited on said layer of photosensitive material having said recessed feature and deposited on said exposed region of said substrate is one or more materials selected from the group consisting of a conductor, a semiconductor and a dielectric material.

19. The method of claim 1 wherein said step of depositing said material comprises the step of depositing a thin film layer of said material on said layer of said photosensitive material having said recessed feature and said exposed region of said substrate.

20. The method of claim 19 wherein said step of removing said layer of photosensitive material lifts off a portion of said thin film layer of material on said layer of photosensitive material having said recessed feature and does not remove at least a portion of said thin film layer of material on said exposed region of said substrate.

21. The method of claim 1 wherein said first and said second radiation is selected from the group consisting of electromagnetic radiation and a beam of electrons.

22. The method of claim 1 wherein said steps of: exposing said first area of said layer of photosensitive material to said first radiation having said first intensity and exposing said second area of said layer of photosensitive material said second to radiation having said second intensity is carried out using a microfabrication technique selected from the group consisting of electron beam lithography, photolithography, deep ultraviolet light lithography, X-ray lithography, and extreme UV lithography.

23. The method of claim 1 wherein said electrode structure on said substrate is said T-gate electrode structure.

24. The method of claim 1 wherein said substrate is a device substrate prepatterned with one or more device components.

25. The method of claim 1 wherein said substrate is a thin film transistor device substrate prepatterned with one or more thin film transistor device components.

26. The method of claim 1 further comprising the step of exposing one or more additional areas of said layer of photosensitive material to an additional radiation having a selected intensity; wherein said additional area of said layer partially overlaps said first area of said layer; said second area of said layer; or both said first and second areas of said layer of photosensitive material.

27. The method of claim 1 wherein said electrode structure on said substrate is said gamma gate electrode structure.

28. The method of claim 1 wherein said electrode structure on said substrate is said shifted T-gate electrode structure.

* * * * *

UNITED STATES PATENT AND TRADEMARK OFFICE
CERTIFICATE OF CORRECTION

| | | |
|---|---|---|
| PATENT NO. | : 8,003,300 B2 | Page 1 of 1 |
| APPLICATION NO. | : 11/734600 | |
| DATED | : August 23, 2011 | |
| INVENTOR(S) | : Jain et al. | |

It is certified that error appears in the above-identified patent and that said Letters Patent is hereby corrected as shown below:

In the Specification:

In claim 1, column 16, line 33, please replace "to radiation having a first intensity" with --to a first radiation having a first intensity--.

In claim 1, column 16, line 38, please replace "layer of photosensitive material" with --layer of said photosensitive material--.

In claim 1, column 16, line 61, please replace "profile in said photosensitive layer" with --profile of said recessed feature in said layer of photosensitive material--.

In claim 5, column 17, line 19, please replace "photosensitive material" with --said photosensitive material--.

In claim 22, column 18, lines 28-29, please replace "photosensitive material said second to radiation" with --photosensitive material to said second radiation--.

Signed and Sealed this
Twenty-fifth Day of October, 2011

David J. Kappos
*Director of the United States Patent and Trademark Office*